US010861950B2

(12) United States Patent
Sengupta et al.

(10) Patent No.: US 10,861,950 B2
(45) Date of Patent: Dec. 8, 2020

(54) INTEGRATED CIRCUIT INCLUDING FIELD EFFECT TRANSISTORS HAVING A CONTACT ON ACTIVE GATE COMPATIBLE WITH A SMALL CELL AREA HAVING A SMALL CONTACTED POLY PITCH

(71) Applicant: Samsung Electronics Co., Ltd., Suwon-si (KR)

(72) Inventors: Rwik Sengupta, Austin, TX (US); Mark Rodder, Dallas, TX (US); Joon Goo Hong, Austin, TX (US); Titash Rakshit, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/121,427

(22) Filed: Sep. 4, 2018

(65) Prior Publication Data

US 2019/0148502 A1    May 16, 2019

Related U.S. Application Data

(63) Continuation-in-part of application No. 15/948,543, filed on Apr. 9, 2018.

(60) Provisional application No. 62/587,214, filed on Nov. 16, 2017.

(51) Int. Cl.
| | |
|---|---|
| *H01L 27/088* | (2006.01) |
| *H01L 29/417* | (2006.01) |
| *H01L 29/78* | (2006.01) |
| *H01L 27/02* | (2006.01) |
| *H01L 21/8234* | (2006.01) |
| *H01L 27/118* | (2006.01) |

(52) U.S. Cl.
CPC ......... *H01L 29/41775* (2013.01); *H01L 21/823418* (2013.01); *H01L 21/823475* (2013.01); *H01L 27/0207* (2013.01); *H01L 27/088* (2013.01); *H01L 27/11807* (2013.01); *H01L 29/41766* (2013.01); *H01L 29/7835* (2013.01)

(58) Field of Classification Search
CPC . H01L 21/78; H01L 23/535; H01L 29/41775; H01L 21/823418
USPC .............. 438/458; 29/25.01; 257/401
See application file for complete search history.

(56) References Cited

U.S. PATENT DOCUMENTS

| | | |
|---|---|---|
| 5,006,911 A | 4/1991 | Sivan |
| 5,955,759 A | 9/1999 | Ismail et al. |
| 6,492,696 B2 | 12/2002 | Morimoto et al. |
| (Continued) | | |

OTHER PUBLICATIONS

U.S. Office Action dated Nov. 28, 2018, issued in U.S. Appl. No. 15/948,543 (14 pages).

(Continued)

*Primary Examiner* — Caleb E Henry
(74) *Attorney, Agent, or Firm* — Lewis Roca Rothgerber Christie LLP

(57) ABSTRACT

A field effect transistor including a source region, a drain region, a channel region extending between the source region and the drain region, a gate on the channel region, a gate contact on the gate at an active region of the gate, a source contact on the source region, a drain contact on the drain region, and recesses in the source and drain contacts substantially aligned with the gate contact. Upper surfaces of the recesses in the source and drain contacts are spaced below an upper surface of the gate by a depth.

16 Claims, 8 Drawing Sheets

(56) References Cited

U.S. PATENT DOCUMENTS

| | | | |
|---|---|---|---|
| 6,686,247 B1 | 2/2004 | Bohr | |
| 7,052,963 B2 | 5/2006 | Williams et al. | |
| 8,618,601 B2 | 12/2013 | Chen | |
| 8,754,483 B2 | 6/2014 | Ponoth et al. | |
| 9,466,570 B1* | 10/2016 | Cheng | H01L 21/76897 |
| 9,478,636 B2 | 10/2016 | Chen et al. | |
| 9,484,306 B1 | 11/2016 | Cheng et al. | |
| 2011/0221009 A1 | 9/2011 | Chuang et al. | |
| 2014/0061775 A1* | 3/2014 | Chuang | H01L 21/823814 |
| | | | 257/329 |
| 2016/0133742 A1* | 5/2016 | Okuda | H01L 29/41766 |
| | | | 257/330 |
| 2016/0336183 A1* | 11/2016 | Yuan | H01L 29/66795 |
| 2017/0110549 A1* | 4/2017 | Xie | H01L 29/41783 |
| 2018/0096850 A1* | 4/2018 | Lu | H01L 21/28132 |
| 2018/0211874 A1 | 7/2018 | Basker et al. | |
| 2018/0211875 A1* | 7/2018 | Basker | H01L 21/76897 |
| 2018/0308750 A1* | 10/2018 | Cheng | H01L 21/76888 |
| 2019/0096761 A1* | 3/2019 | Nieh | H01L 29/4958 |

OTHER PUBLICATIONS

U.S. Office Action dated Sep. 24, 2019, issued in U.S. Appl. No. 15/948,543 (12 pages).

Final Office Action dated Feb. 19, 2020, issued in U.S. Appl. No. 15/948,543 (9 pages).

* cited by examiner

INTEGRATED CIRCUIT INCLUDING FIELD EFFECT TRANSISTORS HAVING A CONTACT ON ACTIVE GATE COMPATIBLE WITH A SMALL CELL AREA HAVING A SMALL CONTACTED POLY PITCH

CROSS-REFERENCE TO RELATED APPLICATION(S)

The present application is a continuation-in-part of U.S. patent application Ser. No. 15/948,543, filed Apr. 9, 2018, which claims priority to and the benefit of U.S. Provisional Application No. 62/587,214, filed Nov. 16, 2017, the entire contents of both of which are incorporated herein by reference.

FIELD

The present disclosure relates generally to field effect transistors and methods of manufacturing the same.

BACKGROUND

Related art standard cell architectures including a gate contact over active area are not compatible with scaled contacted poly pitch (CPP), which is required to scale cell width and cell area. For instance, as illustrated in FIG. 1A, a related art cell architecture 100 includes a pair of field effect transistors (FETs) 101, 102 (e.g., an n-FET and a pFET) each including contacts 103, 104 on source and drain regions 105, 106, respectively, and a contact 107 on an active area of a gate 108. As illustrated FIG. 1B, the height of the contacts 103, 104 on the source and drain regions 105, 106 is at least as tall as the height of the gate 108 such that upper surfaces 109, 110 of the contacts 103, 104 on the source and drain regions 105, 106 are at least as high in the cell 100 as an upper surface 111 of the gate 108. In some art standard cell architectures, the height of the contacts 103, 104 on the source and drain regions 105, 106 may be taller than the height of the gate 108 such that the upper surfaces 109, 110 of the contacts 103, 104 on the source and drain regions 105, 106 are above the upper surface 111 of the gate 108. In this related art configuration, the lateral spacing between the contacts 103, 104 on the source and drain regions 105, 106 and the gate contact over active area 107 cannot be too small or else there will be an electrical short between the contacts 103, 104 on the source and drain regions 105, 106 and the gate contact over active area 107. Conventionally, a thick nitride spacer 112 is provided adjacent to edges of the gate 108 to space the contacts 103, 104 on the source and drain regions 105, 106 sufficiently away from the edges of the gate 108, and thus away from the gate contact over active area 107, to avoid an electrical short between the contacts 103, 104 on the source and drain regions 105, 106 and the gate contact over active area 107. However, the use of the thick spacer 112 limits reducing the gate to gate spacing in the standard cell architecture 100 because there must be adequate space to form the contacts 103, 104 on the source and drain regions 105, 106. In this manner, the use of a thick spacer limits reducing the contacted poly pitch (CPP) of the related art standard cell architecture 100.

SUMMARY

The present disclosure is directed to various embodiments of a field effect transistor. In one embodiment, the field effect transistor includes a source region, a drain region, a channel region extending between the source region and the drain region, a gate on the channel region, a gate contact on the gate at an active region of the gate, a source contact on the source region, a drain contact on the drain region, and recesses in the source and drain contacts substantially aligned with the gate contact. Upper surfaces of the recesses in the source and drain contacts are spaced below an upper surface of the gate by a depth.

The recesses may be provided in the source and drain contacts only at positions proximate to the gate contact.

The depth may be from approximately 10 nm to approximately 40 nm.

A length of each of the recesses along a lengthwise direction of the source and drain regions may be at least as long as a length of the gate contact along a lengthwise direction of the gate.

The field effect transistor may also include a via on the source contact or the drain contact that is staggered relative to the gate contact.

The via may be longitudinally offset from the gate contact in a lengthwise direction of the source contact or the drain contact by a distance from approximately 10 nm to approximately 25 nm.

The present disclosure is also directed to various embodiments of an integrated circuit. In one embodiment, the integrated circuit includes a series of field effect transistors and each field effect transistor includes a source region, a drain region, a channel region extending between the source region and the drain region, a gate on the channel region, a gate contact on the gate at an active region of the gate, a source contact on the source region, a drain contact on the drain region, and recesses in the source and drain contacts substantially aligned with the gate contact. Upper surfaces of the recesses in the source and drain contacts are spaced below an upper surface of the gate by a depth.

For each field effect transistor of the series of field effect transistors, the recesses may be provided in the source and drain contacts only at positions proximate to the gate contact.

For each field effect transistor of the series of field effect transistors, the depth may be from approximately 10 nm to approximately 40 nm.

For each field effect transistor of the series of field effect transistors, a length of each of the recesses along a lengthwise direction of the source and drain regions may be at least as long as a length of the gate contact along a lengthwise direction of the gate.

Each field effect transistor of the series of field effect transistors may also include a via on the source contact or the drain contact that is staggered relative to the gate contact.

The via may be longitudinally offset from the gate contact in a lengthwise direction of the source contact or the drain contact by a distance from approximately 10 nm to approximately 25 nm.

The integrated circuit may also include a shallow trench isolation region between a first field effect transistor of the series of field effect transistors and a second field effect transistor of the series of field effect transistors.

The source region or the drain region of one of the series of field effect transistors may extend across the shallow trench isolation region and connect the first field effect transistor to the second field effect transistor.

The via of one of the first and second field effect transistors may be at the shallow trench isolation region, and an upper surface of the source region or the drain region that extends across the shallow trench isolation regions may include a notch.

The integrated circuit may also include at least one power rail at a boundary of the integrated circuit and a via connecting the source contact of one of the series of field effect transistors to the power rail.

The present disclosure is also directed to various methods of manufacturing a field effect transistor. In one embodiment, the method includes forming source and drain contacts on respective source and drain regions, forming a gate contact on a gate, and forming a recess in each of the source and drain contacts substantially aligned with the gate contact. An upper surface of the recess in each of the source and drain contacts is spaced below an upper surface of the gate by a depth.

Forming the recess in each of the source and drain contacts may be performed only at positions proximate to the gate contact.

Forming the recess may include performing a timed etch through an oxide layer.

The method may also include forming a via on the source region or the drain region that is staggered relative to the gate contact.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1A:
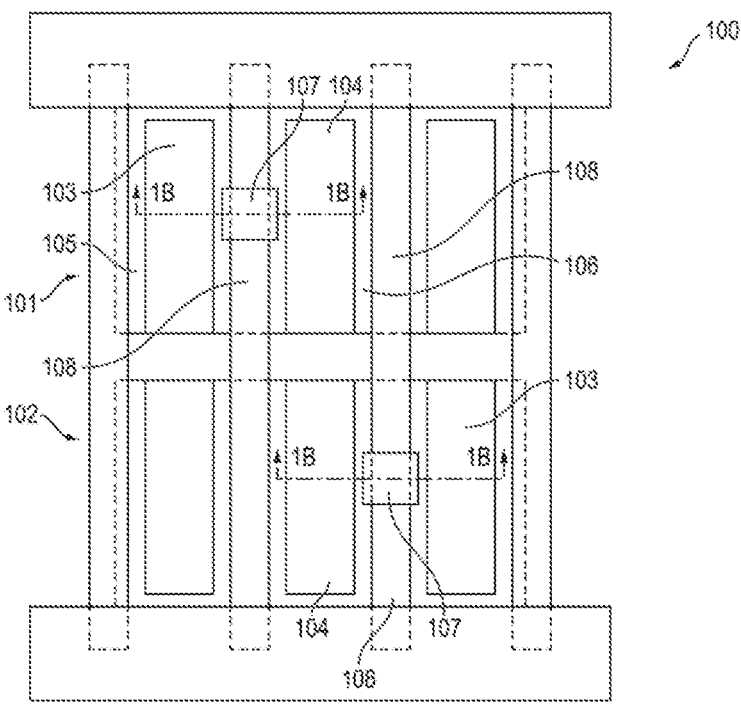
FIGS. 1A-1B are a layout view and a cross-sectional view of a related art integrated circuit.
Figure 1B:
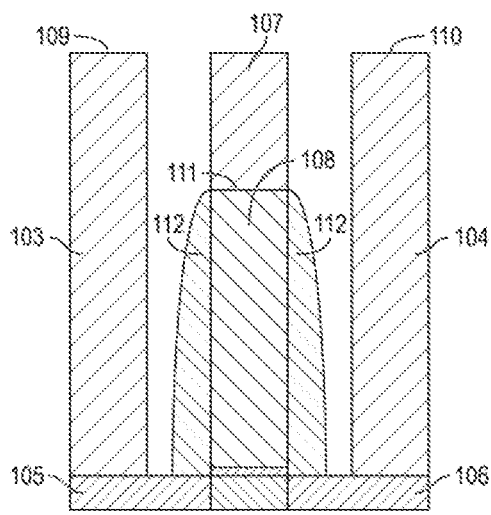

The present disclosure is directed to various embodiments of an integrated circuit including a series of field effect transistors (FETs) configured to enable a shorter contacted poly pitch (CPP) compared to related art FETs without creating an electric short.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
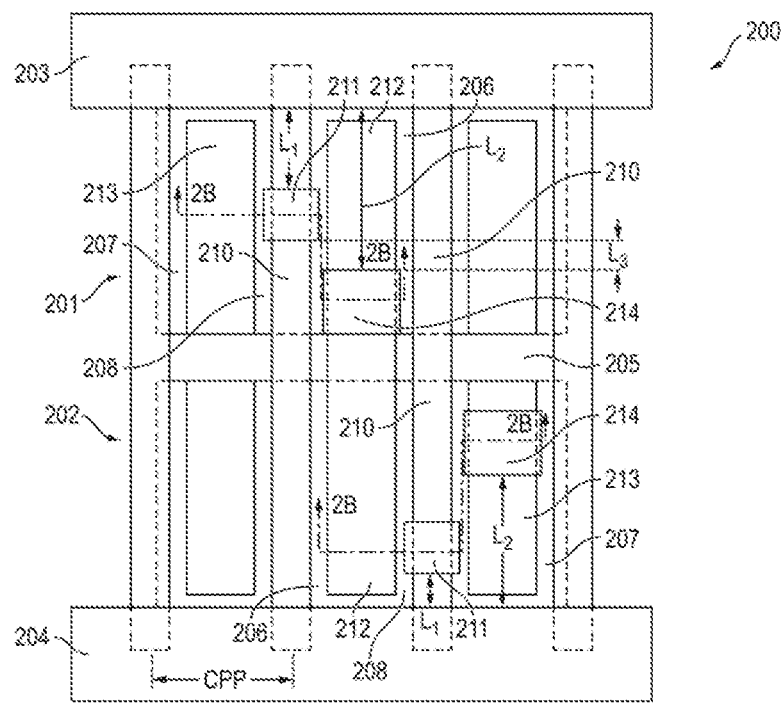
FIGS. 2A-2B are a layout view and a cross-sectional view, respectively, of an integrated circuit according to one embodiment of the present disclosure.
Figure 2B:
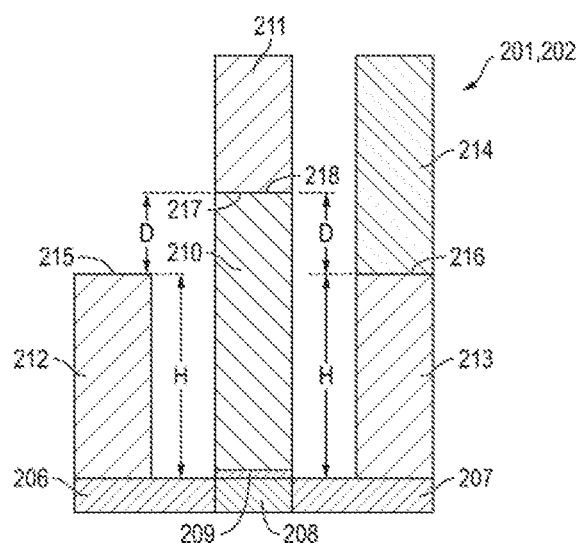

With reference now to FIGS. 2A-2B, an integrated circuit 200 according to one embodiment of the present disclosure includes a first field effect transistor (FET) 201 (e.g., an nFET or a pFET) and a second FET 202 (e.g., a pFET or an nFET). In the illustrated embodiment, the integrated circuit 200 also includes a first power rail 203 (e.g., a power rail in upper metal routing layer M1) extending along a boundary of the FET 200 (e.g., a boundary of the first FET 201), and a second power rail 204 (e.g., a second power rail in upper metal routing layer M1) extending along a boundary of the FET 200 (e.g., a boundary of the second FET 202). Additionally, in the illustrated embodiment, the first FET 201 is separated from the second FET 202 by a shallow trench isolation (STI) region 205.

In the illustrated embodiment, each of the FETs 201, 202 includes source and drain regions 206, 207, a channel region 208 extending between the source and drain regions 206, 207, a gate oxide layer 209 on the channel region 208, and a gate 210 on the gate oxide layer 209. Additionally, in the illustrated embodiment, each of the FETs 201, 202 includes a contact 211 on (e.g., directly on) the gate 210 at an active area of the gate 210 on the channel region 208 (e.g., a contact over active gate (COAG)). In the illustrated embodiment, each of the FETs 201, 202 also includes contacts 212, 213 on (e.g., directly on) the source and drain regions 206, 207, respectively. Additionally, in the illustrated embodiment, each of the FETs 201, 202 also includes a via 214 on (e.g., directly on) at least one of the contacts 212, 213 connected to the source and drain regions 206, 207.

As illustrated in FIG. 2B, for each of the FETs 201, 202, upper surfaces 215, 216 of the contacts 212, 213 on the source and drain regions 206, 207, respectively, are spaced below an upper surface 217 of the gate 210 (e.g., top surfaces 215, 216 of the contacts 212, 213 on the source and drain regions 206, 207 facing away from source and drain regions 206, 207 are spaced below a top surface 217 of the gate 210 facing away from the channel region 208). Accordingly, the upper surfaces 215, 216 of the contacts 212, 213 on the source and drain regions 206, 207 are also spaced below a lower surface 218 of the contact 211 on the upper surface 217 of the gate 210 (e.g., the upper surfaces 215, 216 of the contacts 212, 213 on the source and drain regions 206, 207 are below interfacing surfaces 217, 218 between the gate 210 and the contact 211 on the gate 210. Spacing the upper surfaces 215, 216 of the contacts 212, 213 on the source and drain regions 206, 207 below the upper surface 217 of the gate 210 and the lower surface 218 of the contact 211 on the gate 210 is configured to enable a shorter contacted poly pitch (CPP) (e.g., a shorter pitch between adjacent gates 210 of the integrated circuit 200) compared to related art integrated circuits without causing an electrical short between the contacts 212, 213 on the source and drain regions 206, 207 and the contact 211 over the active area of the gate 210. Additionally, spacing the upper surfaces 215, 216 of the contacts 212, 213 on the source and drain regions 206, 207 below the upper surface 217 of the gate 210 and below the lower surface 218 of the contact 211 over the active area of the gate 210 is configured to reduce the Miller capacitance between the contacts 212, 213 and the gate 210 compared to a related art FET in which the upper surfaces of the contacts on the source and drain regions are not below the upper surface of the gate.

In one or more embodiments, the upper surfaces of the contacts 212, 213 on the source and drain regions 206, 207 are spaced below the lower surface 217 of the contact 211 on the active area of the gate 210 by a distance D (e.g., a depth) from approximately 10 nm to approximately 40 nm (e.g., the upper surfaces 215, 216 of the contacts 212, 213 on the source and drain regions 206, 207 are spaced below the upper surface 217 of the gate 210 by a distance D from approximately 10 nm to approximately 40 nm). In one or more embodiments, the upper surfaces 215, 216 of the contacts 212, 213 on the source and drain regions 206, 207 are spaced below the lower surface 218 of the contact 211 on the active area of the gate 210 by a distance D (e.g., a depth) from approximately 12 nm to approximately 25 nm (e.g., the upper surfaces 215, 216 of the contacts 212, 213 on the source and drain regions 206, 207 are spaced below the lower surface 218 of the contact 211 on the gate 210 by a distance D from approximately 12 nm to approximately 25 nm). In one or more embodiments, the contacts 212, 213 on the source and drain regions 206, 207 have a height H from approximately 2 nm to approximately 10 nm. In one or more embodiments, the contacts 212, 213 on the source and drain regions 206, 207 may be formed of a silicide metal, such as titanium (Ti), cobalt (Co), or nickel (Ni).

As illustrated in FIG. 2A, for each of the FETs 201, 202, the via 214 on one of the contacts 212, 213 on the source and drain regions 206, 207 is staggered (e.g., diagonally offset) from the contact 211 on the active area of the gate 210 such that the via is not laterally aligned with the contact 211 on the active area of the gate 210. For instance, as illustrated in FIG. 2A, for each of the FETs 201, 202, the contact 211 on the active area of the gate 210 is longitudinally spaced apart from the respective power rail 203, 204 by a first distance $L_1$ along the lengthwise direction of the gate 210 and the via 214 is spaced apart from the respective power rail 203, 204 by a second distance $L_2$ along the lengthwise direction of the contact 212 or 213 greater than the first distance $L_1$ (e.g., for each FET 201, 202, the via 214 is spaced closer to the STI region 205 of the integrated circuit 200 than the contact 211 on the active area of the gate 210). In one or more embodiments, the contact 211 on the active area of the gate 210 may be longitudinally spaced apart from the via 214 by a distance $L_3$ along the lengthwise direction of the contact 212 or 213 from approximately 10 nm to approximately 25 nm. Staggering the via 214 from the contact 211 on the active area of the gate 210 such that the via 214 and the contact 211 on the active area of the gate 210 are not laterally aligned is configured to enable a shorter CPP (e.g., a shorter pitch between adjacent gates 210 of the integrated circuit 200) compared to related art FETs without causing an electrical short between the via 214 and the contact 211 on the active area of the gate 210. For instance, in one or more embodiments, the integrated circuit 200 of the present disclosure may have a CPP of less than approximately 48 nm (e.g., approximately 40 nm or less).

Figure 3:
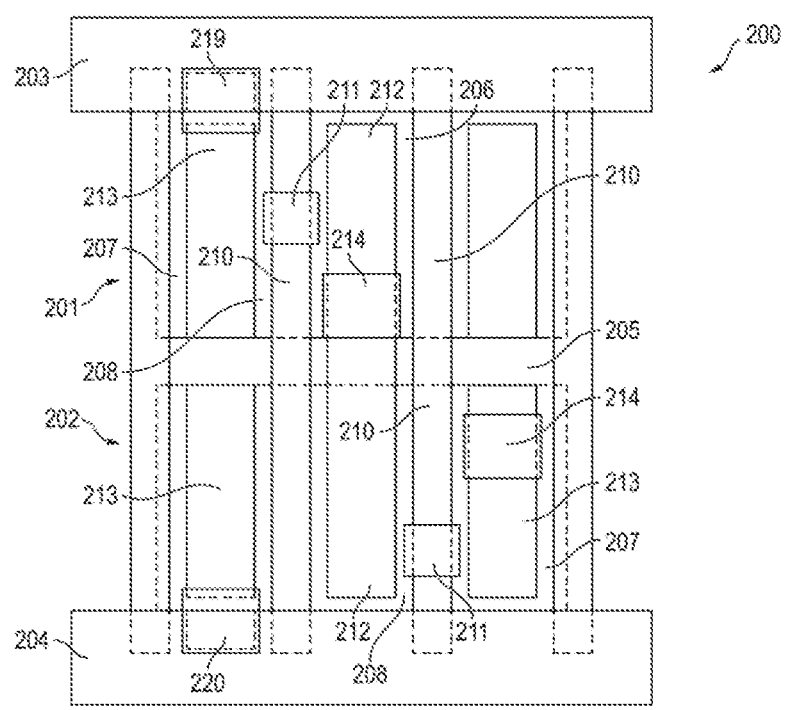
FIG. 3 is a layout view of integrated circuit according to one embodiment of the present disclosure.

With reference now to FIG. 3, in one or more embodiments, each of the FETs 201, 202 of the integrated circuit 200 may include a via 219, 220 connecting one of the contacts 212, 213 on the source and drain regions 206, 207 to one of the power rails 203, 204, respectively (e.g., the vias 219, 220 extend from upper surfaces 216 of the contacts 212, 213 on the source and drain regions 206, 207 to the power rails 203, 204 in one of the upper metal routing layers, such as upper metal routing layer M1).

Figure 4:
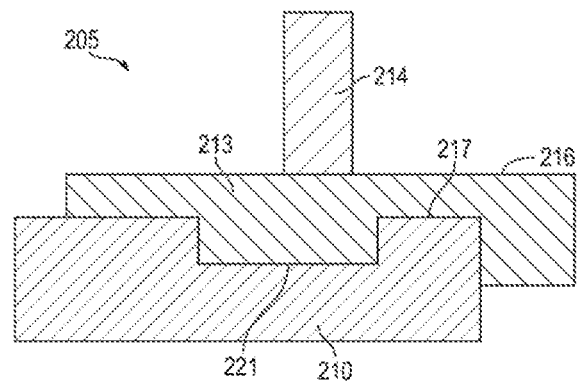
FIG. 4 is a cross-sectional view of an integrated circuit according to one embodiment of the present disclosure.

In the embodiment of the integrated circuit 200 illustrated in FIGS. 2A and 3, one of the contacts 213 on one of the source and drain regions 206, 207 extends over (e.g., across) the STI region 205 and connects the first and second FETs 201, 202 together. With reference now to FIG. 4, in one or more embodiments in which one of the contacts 213 on one of the source and drain regions 206, 207 extends over the STI region 205 and connects the first and second FETs 201, 202 together, one of the vias 214 (e.g., the via 214 of the first FET 201) may be positioned on the contact 213 in the STI region 205. Additionally, in the illustrated embodiment, a portion of the gate 210 in the STI region 205 includes a recess 221 in the upper surface 217 of the gate 210. In the side view of FIG. 4, the recess 221 in the upper surface 217 of the gate 210 is under the via 214 on the contact 213 in the STI region 205 (e.g., the via 214 on the contact 213 and the recess 221 in the gate 210 are longitudinally aligned in a lengthwise direction along the contact 213 and the gate 210). The recess 221 in the portion of the gate 210 under the via 214 in the STI region 205 is configured to improve the process margin between the via 214 and the gate 210.

With reference now to FIGS. 5A-5D, an integrated circuit 300 according to one embodiment of the present disclosure includes a first FET 301 (e.g., an nFET or a pFET) and a second FET 302 (e.g., a pFET or an nFET). In the illustrated embodiment, the integrated circuit 300 also includes a first power rail 303 (e.g., a power rail in upper metal routing layer M1) extending along a boundary of the FET 300 (e.g., a boundary of the first FET 301), and a second power rail 304 (e.g., a second power rail in upper metal routing layer M1) extending along a boundary of the FET 300 (e.g., a boundary of the second FET 302). Additionally, in the illustrated embodiment, the first FET 301 is separated from the second FET 302 by a shallow trench isolation (STI) region 305.

In the illustrated embodiment, each of the FETs 301, 302 includes source and drain regions 306, 307, a channel region 308 extending between the source and drain regions 306, 307, a gate oxide layer 309 on the channel region 308, and a gate 310 on the gate oxide layer 309. Additionally, in the illustrated embodiment, each of the FETs 301, 302 includes a contact 311 on (e.g., directly on) the gate 310 at an active area of the gate 310 on the channel region 308 (e.g., a contact over active gate (COAG)). In the illustrated embodiment, each of the FETs 301, 302 also includes contacts 312, 313 on (e.g., directly on) the source and drain regions 306, 307, respectively. Additionally, in the illustrated embodiment, each of the FETs 301, 302 also includes a via 314 on (e.g., directly on) at least one of the contacts 312, 313 connected to the source and drain regions 306, 307.

Figure 5A:
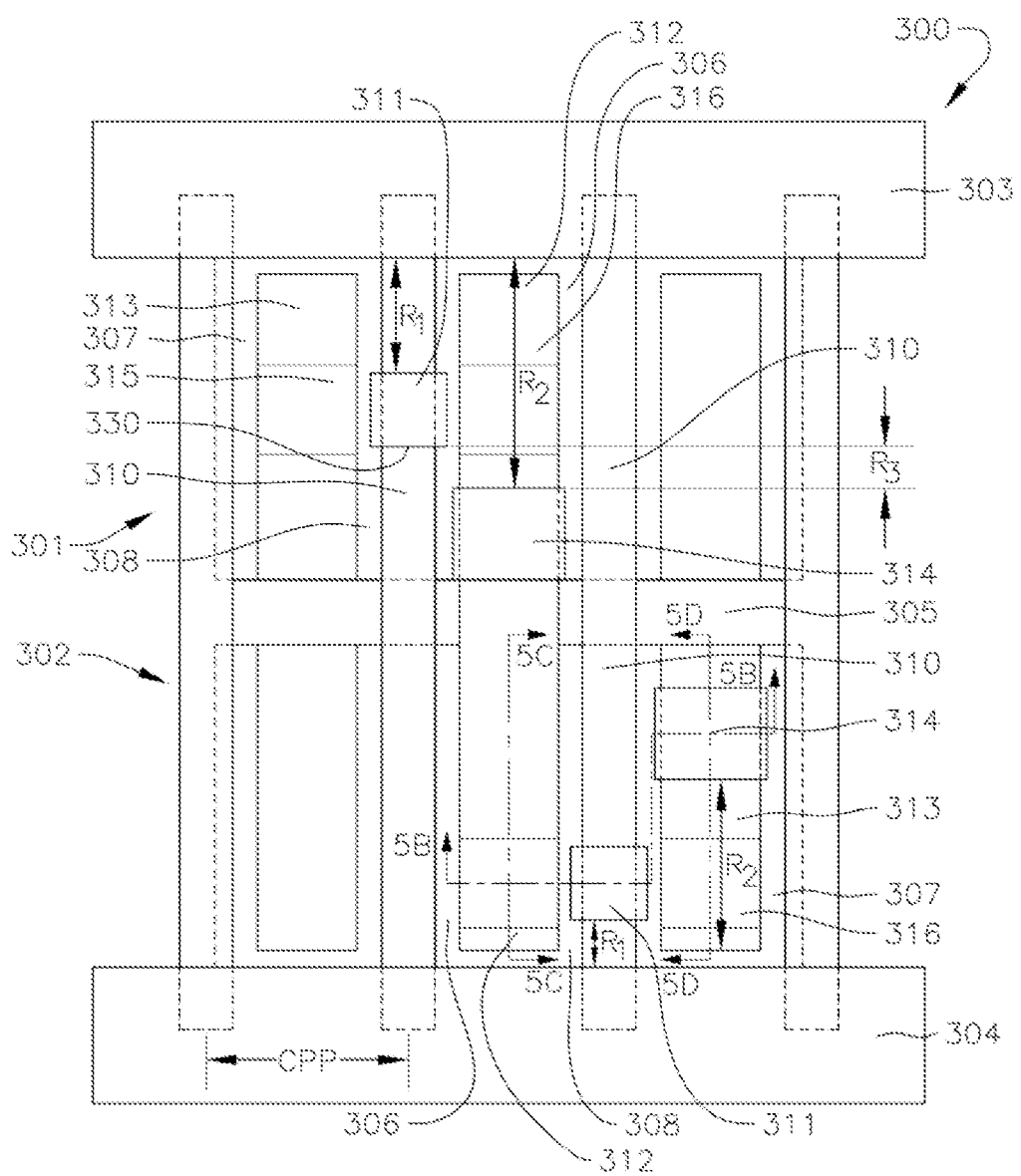
FIGS. 5A-5D are a layout view and cross-sectional views of an integrated circuit according to one embodiment of the present disclosure.
Figure 5B:
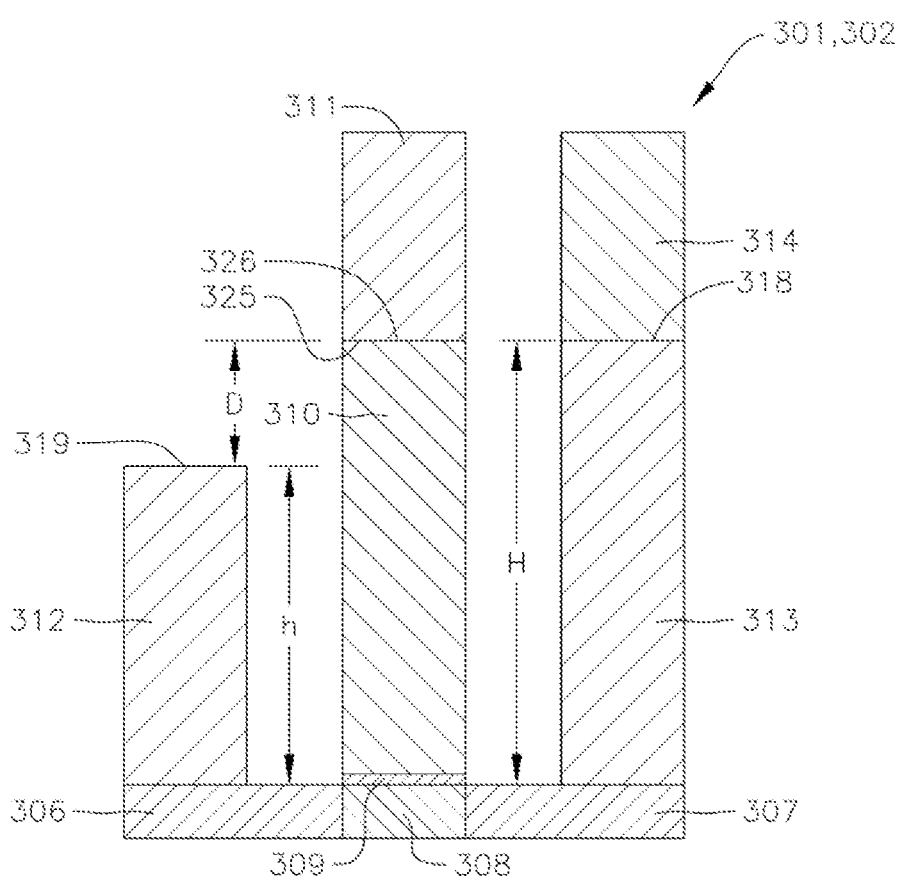
Figure 5C:
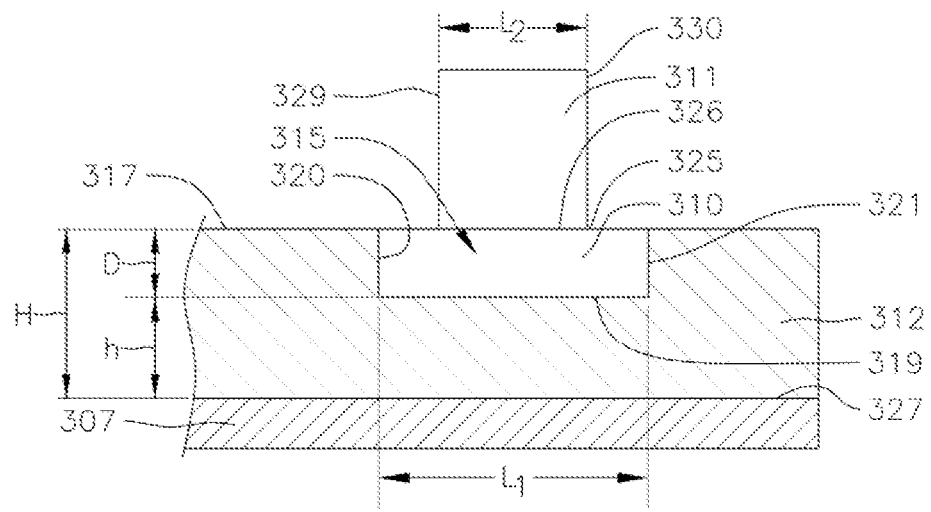
Figure 5D:
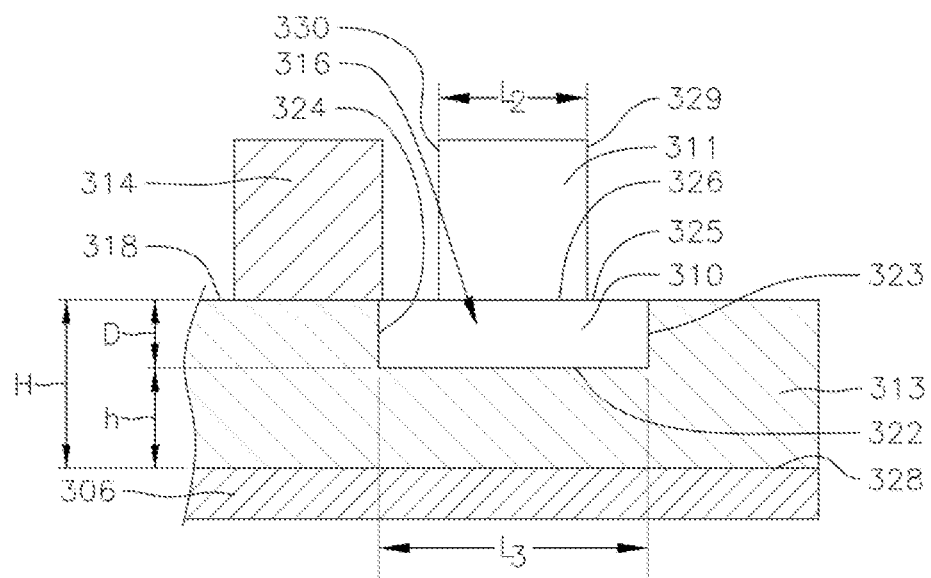

As illustrated in FIG. 5C-5D, for each of the FETs 301, 302, the contacts 312, 313 on the source and drain regions 306, 307 have recesses 315, 316, respectively. The recesses 315, 316 extend downward from an upper surface 317, 318 of the contacts 312, 313, respectively. In the illustrated embodiment, for each of the FETs 301, 302, the recess 315 in the contact 312 is aligned or substantially aligned in a lengthwise direction of the contact 312 and the source/drain region 306 with the contact 311 on the gate 310 (e.g., the recess 315 in the contact 312 is laterally aligned or substantially laterally aligned with the contact 311 on the gate 310). Additionally, in the illustrated embodiment, for each of the FETS 301, 302, the recess 315 in the contact 312 has a length $L_1$ along the lengthwise direction of the contact 312 and the source/drain region 306 that is at least a long as a length $L_2$ of the contact 311 along a lengthwise direction of the gate 310 (e.g., the length $L_1$ of the recess 315 in the contact 312 along the lengthwise direction of the contact 312 and the source/drain region 307 is longer than the length $L_2$ of the contact 311 along the lengthwise direction of the gate 310). In the illustrated embodiment, for each of the FETs 301, 302, the recess 316 in the contact 313 is aligned or substantially aligned in a lengthwise direction of the contact 313 and the source/drain region 307 with the contact 311 on the gate 310 (e.g., the recess 316 in the contact 313 is laterally aligned or substantially laterally aligned with the contact 311 on the gate 310). Additionally, in the illustrated embodiment, for each of the FETS 301, 302, the recess 316 in the contact 313 has a length $L_3$ along the lengthwise direction of the contact 313 and the source/drain region 307 that is at least a long as the length $L_2$ of the contact 311 along the lengthwise direction of the gate 310 (e.g., the length $L_3$ of the recess 316 in the contact 313 along the lengthwise direction of the contact 313 and the source/drain region 307 is longer than the length $L_2$ of the contact 311 along the lengthwise direction of the gate 310). In one or more embodiments, the length $L_3$ of the recess 316 in the contact 313 along the lengthwise direction of the contact 313 and the source/drain region 307 may be equal or substantially equal to the length $L_1$ of the recess 315 in the contact 312 along the lengthwise direction of the contact 312 and the source/drain region 306. In one or more embodiments, the length $L_3$ of the recess 316 in the contact 313 along the lengthwise direction of the contact 313 and the source/drain region 307 may be different (e.g., longer or shorter) than the length $L_1$ of the recess 315 in the contact 312 along the lengthwise direction of the contact 312 and the source/drain region 306.

In the illustrated embodiment, for each of the FETs 301, 302, the recess 315 in the contact 312 includes a bottom surface 319 facing away from the source/drain region 306, and a pair of sidewalls 320, 321 at opposite ends of the bottom surface 319 extending from the bottom surface 319 of the recess 315 to the upper surface 317 of the contact 312. In the illustrated embodiment, the recess 315 in the contact 312 has a rectangular or substantially rectangular cross-sectional shape. Additionally, in the illustrated embodiment, for each of the FETs 301, 302, the recess 316 in the contact 313 includes a bottom surface 322 facing away from the source/drain region 307, and a pair of sidewalls 323, 324 at opposite ends of the bottom surface 322 extending from the bottom surface 322 of the recess 316 to the upper surface 318 of the contact 313. In the illustrated embodiment, the recess 316 in the contact 313 has a rectangular or substantially rectangular cross-sectional shape.

In the illustrated embodiment, for each of the FETs 301, 302, the bottom surfaces 319, 322 of the recesses 315, 316, respectively, are each spaced below an upper surface 325 of the gate 310 (e.g., the bottom surfaces 319, 322 of the recesses 315, 316 in the contacts 312, 313 facing away from source and drain regions 306, 307 are spaced below the top surface 325 of the gate 310 facing away from the channel region 308). Accordingly, the bottom surfaces 319, 322 of the recesses 315, 316 in the contacts 312, 313 on the source and drain regions 306, 307 are also spaced below a lower surface 326 of the contact 311 on the upper surface 325 of the gate 310 (e.g., the bottom surfaces 319, 322 of the recesses 315, 316 in the contacts 312, 313 on the source and drain regions 306, 307 are below interfacing surfaces 325, 326 between the gate 310 and the contact 311 on the gate 310). Spacing the bottom surfaces 319, 322 of the recesses 315, 316 in the contacts 312, 313 on the source and drain regions 306, 307 below the upper surface 325 of the gate 310 and the lower surface 326 of the contact 311 on the gate 310 is configured to enable a shorter contacted poly pitch (CPP) (e.g., a shorter pitch between adjacent gates 310 of the integrated circuit 300) compared to related art integrated circuits without causing an electrical short between the contacts 312, 313 on the source and drain regions 306, 307 and the contact 311 over the active area of the gate 310. Additionally, spacing the bottom surfaces 319, 322 of the recesses 315, 316 in the contacts 312, 313 on the source and drain regions 306, 307 below the upper surface 325 of the gate 310 and below the lower surface 326 of the contact 311 over the active area of the gate 310 is configured to reduce the Miller capacitance between the contacts 312, 313 and the gate 310 compared to a related art FET in which the upper surfaces of the contacts on the source and drain regions are not below the upper surface of the gate.

In one or more embodiments, the bottom surfaces 319, 322 of the recesses 315, 316 in the contacts 312, 313 on the source and drain regions 306, 307 are spaced below the lower surface 325 of the contact 311 on the active area of the gate 310 by a distance D (e.g., a depth) from approximately 10 nm to approximately 40 nm (e.g., the bottom surfaces 319, 322 of the recesses 315, 316 in the contacts 312, 313 on the source and drain regions 306, 307 are spaced below the upper surface 325 of the gate 310 by a distance D from approximately 10 nm to approximately 40 nm). In one or more embodiments, the bottom surfaces 319, 322 of the recesses 315, 316 in the contacts 312, 313 on the source and drain regions 306, 307 are spaced below the lower surface 326 of the contact 311 on the active area of the gate 310 by a distance D (e.g., a depth) from approximately 12 nm to approximately 25 nm (e.g., the bottom surfaces 319, 322 of the recesses 315, 316 in the contacts 312, 313 on the source and drain regions 306, 307 are spaced below the lower surface 326 of the contact 311 on the gate 310 by a distance D from approximately 12 nm to approximately 25 nm).

In one or more embodiments, portions of the contacts 312, 313 on the source and drain regions 306, 307 having the recesses 315, 316, respectively, have a height h from approximately 2 nm to approximately 10 nm. In the illustrated embodiment, the height h is measured from an upper surface 327, 328 of the respective source and drain region 306, 307 to the bottom surface 319, 322 of the respective recess 315, 316. Additionally, in one or more embodiments, portions of the contacts 312, 313 on the source and drain regions 306, 307 not including the recesses 315, 316 have a height H from approximately 12 nm to approximately 50 nm. In one or more embodiments, the height H of the portions of the contacts 312, 313 not including the recesses 315, 316 may be at least as tall as the height of the gate 310 (e.g., the height H of the portions of the contacts 312, 313 not including the recesses 315, 316 may equal or substantially equal to the combined height of the gate 310 and the gate oxide layer 309). In one or more embodiments, for each of the FETs 301, 302, the upper surfaces 317, 318 of the portions of the contacts 312, 313 not including the recesses 315, 316 may not be spaced below the upper surface 325 of the gate 310 and the lower surface 326 of the contact 311 on the gate 310. In one or more embodiments, the upper surfaces 317, 318 of the contacts 312, 313 may be aligned or substantially aligned with the upper surface 325 of the gate 310 and the lower surface 326 of the contact 311 on the gate 310. In one or more embodiments, the recesses 315, 316 in the contacts 312, 313 on the source and drain regions 306, 307 may be provided only in portions of the contacts 312, 313, respectively, that are proximate (e.g., aligned or substantially aligned) with the contact 311 on the gate 310. Providing the recesses 315, 316 only in the portions of the contacts 312, 313 that are proximate to the contact 311 on the gate 310 is configured to reduce the resistance of the contacts 312, 313 compared to contacts in which the entire upper surfaces of the contacts are recessed (e.g., spaced below) the upper surface of the gate, as shown, for instance, in the embodiment illustrated in FIGS. 2A-2B.

In one or more embodiments, the length $L_1$ of the recess 315 in the contact 312 is from approximately 24 nm to approximately 50 nm longer than the length $L_2$ of the contact 311 on the gate 310. In one or more embodiments, the sidewall 320 of the recess 315 in the contact 312 is spaced apart from a corresponding sidewall 329 of the contact 311 on the gate 310 by a distance from approximately 12 nm to approximately 25 nm, and the sidewall 321 of the recess 315 is spaced apart from a corresponding sidewall 330 of the contact 311 on the gate 310 by a distance from approximately 12 nm to approximately 25 nm (e.g., the sidewalls 320, 329 of the recess 315 and the contact 311, respectively, that face each other are spaced apart from each other by a distance from approximately 12 nm to approximately 25 nm, and the other sidewalls 321, 330 of the recess 315 and the contact 311, respectively, that face each other are spaced apart from each other by a distance from approximately 12 nm to approximately 25 nm). In one or more embodiments, the length $L_3$ of the recess 316 in the contact 313 is from approximately 24 nm to approximately 50 nm longer than the length $L_2$ of the contact 311 on the gate 310. In one or more embodiments, the sidewall 323 of the recess 316 in the contact 313 is spaced apart from the sidewall 329 of the contact 311 on the gate 310 by a distance from approximately 12 nm to approximately 25 nm, and the sidewall 324 of the recess 316 is spaced apart from the sidewall 330 of the contact 311 on the gate 310 by a distance from approximately 12 nm to approximately 25 nm (e.g., the sidewalls 323, 329 of the recess 316 and the contact 311, respectively, that face each other are spaced apart from each other by a distance from approximately 12 nm to approximately 25 nm, and the other sidewalls 324, 330 of the recess 316 and the contact 311, respectively, that face each other are spaced apart from each other by a distance from approximately 12 nm to approximately 25 nm). In one or more embodiments, recess 315 in the contact 312 is aligned or substantially aligned with the recess 316 in the contact 313. In one or more embodiments, the length $L_1$ of the recess 315 in the contact 312 is the same or substantially the same as the length $L_3$ of the recess 316 in the contact 313.

In one or more embodiments, the contacts 312, 313 on the source and drain regions 306, 307 may be formed of a silicide metal, such as titanium (Ti), cobalt (Co), or nickel (Ni).

With continued reference to the embodiment illustrated in FIG. 5A, for each of the FETs 301, 302, the via 314 on one of the contacts 312, 313 on the source and drain regions 306, 307 is staggered (e.g., diagonally offset) from the contact 311 on the active area of the gate 310 such that the via is not laterally aligned with the contact 311 on the active area of the gate 310. For instance, as illustrated in FIG. 5A, for each of the FETs 301, 302, the contact 311 on the active area of the gate 310 is longitudinally spaced apart from the respective power rail 303, 304 by a first distance $R_1$ along the lengthwise direction of the gate 310 and the via 314 is spaced apart from the respective power rail 303, 304 by a second distance $R_2$ along the lengthwise direction of the contact 312 or 313 greater than the first distance $R_1$ (e.g., for each FET 301, 302, the via 314 is spaced closer to the STI region 305 of the integrated circuit 300 than the contact 311 on the active area of the gate 310). In one or more embodiments, the contact 311 on the active area of the gate 310 may be longitudinally spaced apart from the via 314 by a distance $R_3$ along the lengthwise direction of the contact 312 or 313 from approximately 10 nm to approximately 25 nm. Staggering the via 314 from the contact 311 on the active area of the gate 310 such that the via 314 and the contact 311 on the active area of the gate 310 are not laterally aligned is configured to enable a shorter CPP (e.g., a shorter pitch between adjacent gates 310 of the integrated circuit 300) compared to related art FETs without causing an electrical short between the via 314 and the contact 311 on the active area of the gate 310. For instance, in one or more embodiments, the integrated circuit 300 of the present disclosure may have a CPP of less than approximately 48 nm (e.g., approximately 40 nm or less).

Figure 6:
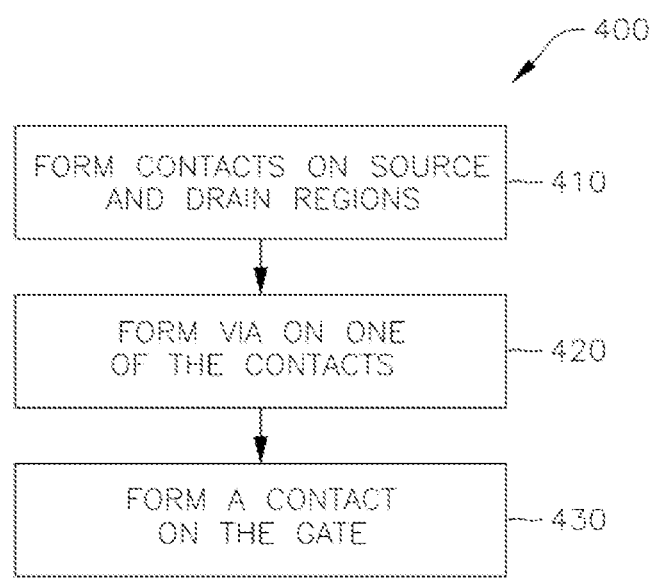
FIG. 6 is a flowchart illustrating tasks of a method of manufacturing an integrated circuit according to one embodiment of the present disclosure.

FIG. 6 is a flowchart illustrating tasks of a method of manufacturing an integrated circuit including a plurality of FETs according to one embodiment of the present disclosure. In the illustrated embodiment, the method 400 includes a task 410 of forming contacts on source and drain regions of each of the FETs. The task 410 of forming the contacts may be performed utilizing a self-aligned contact (SAC) process. In one or more embodiments, the task 410 of forming the contacts on the source and drain regions may include depositing a cap (e.g., a nitride cap) over the gate of each of the FETs, etching holes through a dielectric material (e.g., an oxide material on the source and drain regions) to the underlying source and drain regions, filling the holes with a material of the contacts (e.g., cobalt (Co), ruthenium (Ru), copper (Cu), or tungsten (W)), performing a chemical mechanical planarization (CMP) process on the material of the contacts filled in the holes of the dielectric material, and performing a timed recess etch on the material of the contacts filled in the holes of the dielectric material to recess the material to a desired depth. The timed recess etch on the material of the contacts filled in the holes of the dielectric material is selective to the dielectric material on the source and drain regions and selective to the material of the cap (e.g., the nitride cap) on the gate. In one or more embodiments, the task 410 of forming the contacts on the source and drain regions may include a task of forming recesses (e.g., by a selective etch process) in portions of the contacts.

In the illustrated embodiment, for each of the FETs of the integrated circuit, the method 400 also includes a task 420 of forming a via on at least one of the contacts on the source and drain regions, and a task 430 of forming a contact on the gate. The tasks 420, 430 of forming the via on the contacts of the source and drain regions and forming the contact on the gate may be performed by depositing a second dielectric material (e.g., an oxide distinct from the nitride cap on the gate) to fill in the recess formed in the material of the contacts during the task 410 of forming the contacts. The tasks 420, 430 of forming the via on the contacts of the source and drain regions and forming the contact on the gate may also include forming via openings in the dielectric materials to the underlying material of the contacts (e.g., a lithographic process to pattern the via openings and an etch to form the via openings through the dielectric materials to the underlying material of the contacts), and forming a contact opening in the dielectric materials (e.g., the oxide and the nitride cap) on the gate (e.g., a lithographic process to pattern the contact opening and an etch to form the contact opening through the dielectric materials to the underlying gate). In one or more embodiments, the tasks 420, 430 of forming the via on the contacts of the source and drain regions and forming the contact on the gate may include depositing a metal (e.g., Co, Ru, Cu, or tungsten (W)) in the via openings and the contact opening. In one or more embodiments, the metal material deposited in the via openings may be the same as the metal material deposited in the contact openings, although in one or more embodiments, the metal material deposited in the via openings may be different than the metal material deposited in the contact openings. Accordingly, the via on the contacts of the source and drain regions may be formed from the same metal or a different metal than the contact on the drain.

Following the task 410 of forming the contacts on the source and drain regions for each of the FETs of the integrated circuit, upper surfaces of the contacts on the source and drain regions, or upper surfaces of recesses in the contacts, are spaced below an upper surface of the gate (e.g., the upper surfaces of the contacts, or the upper surfaces of the recesses in the contacts, may be spaced below the upper surface of the gate by a depth from approximately 10 nm to approximately 40 nm, such as from approximately 12 nm to approximately 25 nm). Additionally, following the task 430 of forming the contact on the gate, the upper surfaces of the contacts on the source and drain regions, or the upper surfaces of the recesses in the contacts, are spaced below a lower surface of the contact on the upper surface of the gate (e.g., the upper surfaces of the contacts on the source and drain regions, or the upper surfaces of the recesses in the contacts, may be spaced below the lower surface of the contact on the gate by a depth from approximately 10 nm to approximately 40 nm, such as from approximately 12 nm to approximately 25 nm). In one or more embodiments in which the task 410 includes forming recesses in the contacts on the source and drain regions, the recesses may be aligned or substantially aligned with the contact on the gate in a lengthwise direction of the contacts on the source and drain regions (e.g., the recesses in the contacts on the source and drain regions may be laterally aligned or substantially laterally aligned with the contact on the gate). As described above, spacing the upper surfaces of the contacts on the source and drain regions, or the upper surfaces of the recesses in the contacts, below the upper surface of the gate and below the lower surface of the contact on the gate is configured to enable a shorter contacted poly pitch (CPP) compared to related art integrated circuits without causing an electrical short between the contacts on the source and drain regions and the contact over the active area of the gate. Spacing the upper surfaces of the contacts on the source and drain regions, or the upper surfaces of the recesses in the contacts, below the upper surface of the gate and below the lower surface of the contact over the active area of the gate is also configured to reduce the Miller capacitance between the contacts and the gate compared to a related art FET in which the upper surfaces of the contacts on the source and drain regions are not below the upper surface of the gate.

Additionally, following the tasks 420, 430 of forming the via on one of the contacts of the source and drain regions and forming the contact on the gate, the via is staggered (e.g., diagonally offset) from the contact on the active area of the gate such that the via is not laterally aligned with the contact on the active area of the gate (e.g., the contact on the active area of the gate may be longitudinally spaced apart from the via by a distance along the lengthwise direction of the gate from approximately 10 nm to approximately 25 nm). As described above, staggering the via on the contact of one of the source and drain regions from the contact on the active area of the gate such that the via and the contact on the active area of the gate are not laterally aligned is configured to enable a shorter CPP compared to related art integrated circuits without causing an electrical short between the via and the contact on the active area of the gate.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A field effect transistor comprising:
   a source region;
   a drain region;
   a channel region extending between the source region and the drain region;
   a gate on the channel region;
   a gate contact on the gate at an active region of the gate;
   a source contact on the source region;
   a drain contact on the drain region; and
   recesses in the source and drain contacts substantially aligned with the gate contact,
   wherein upper surfaces of the recesses in the source and drain contacts are spaced below an upper surface of the gate by a depth, and
   wherein the recesses in the source and drain contacts are entirely filled with a dielectric material.

2. The field effect transistor of claim 1, wherein the recesses are provided in the source and drain contacts only at positions proximate to the gate contact.

3. The field effect transistor of claim 1, wherein the depth is from approximately 10 nm to approximately 40 nm.

4. The field effect transistor of claim 1, wherein a length of each of the recesses along a lengthwise direction of the source and drain regions is at least as long as a length of the gate contact along a lengthwise direction of the gate.

5. The field effect transistor of claim 1, further comprising a via on the source contact or the drain contact, wherein the via is staggered relative to the gate contact.

6. The field effect transistor of claim 5, wherein the via is longitudinally offset from the gate contact in a lengthwise direction of the source contact or the drain contact by a distance from approximately 10 nm to approximately 25 nm.

7. An integrated circuit comprising:
   a plurality of field effect transistors, each field effect transistor comprising:
   a source region;
   a drain region;
   a channel region extending between the source region and the drain region;
   a gate on the channel region;
   a gate contact on the gate at an active region of the gate;
   a source contact on the source region;
   a drain contact on the drain region; and
   recesses in the source and drain contacts substantially aligned with the gate contact,
   wherein upper surfaces of the recesses in the source and drain contacts are spaced below an upper surface of the gate by a depth, and
   wherein the recesses in the source and drain contacts are entirely filled with a dielectric material.

8. The integrated circuit of claim 7, wherein, for each field effect transistor of the plurality of field effect transistors, the recesses are provided in the source and drain contacts only at positions proximate to the gate contact.

9. The integrated circuit of claim 7, wherein, for each field effect transistor of the plurality of field effect transistors, the depth is from approximately 10 nm to approximately 40 nm.

10. The integrated circuit of claim 7, wherein, for each field effect transistor of the plurality of field effect transistors, a length of each of the recesses along a lengthwise direction of the source and drain regions is at least as long as a length of the gate contact along a lengthwise direction of the gate.

11. The integrated circuit of claim 7, wherein each field effect transistor of the plurality of field effect transistors further comprises a via on the source contact or the drain contact, and wherein the via is staggered relative to the gate contact.

12. The integrated circuit of claim 8, wherein the via is longitudinally offset from the gate contact in a lengthwise direction of the source contact or the drain contact by a distance from approximately 10 nm to approximately 25 nm.

13. The integrated circuit of claim 7, further comprising a shallow trench isolation region between a first field effect transistor of the plurality of field effect transistors and a second field effect transistor of the plurality of field effect transistors.

14. An integrated circuit comprising:
   a plurality of field effect transistors, each field effect transistor comprising:
   a source region;
   a drain region;
   a channel region extending between the source region and the drain region;
   a gate on the channel region;
   a gate contact on the gate at an active region of the gate;
   a source contact on the source region;
   a drain contact on the drain region; and
   recesses in the source and drain contacts substantially aligned with the gate contact,
   wherein upper surfaces of the recesses in the source and drain contacts are spaced below an upper surface of the gate by a depth; and
   a shallow trench isolation region between a first field effect transistor of the plurality of field effect transistors and a second field effect transistor of the plurality of field effect transistors,
   wherein the source region or the drain region of one of the plurality of field effect transistors extends across the shallow trench isolation region and connects the first field effect transistor to the second field effect transistor.

15. The integrated circuit of claim 14, wherein the via of one of the first and second field effect transistors is at the shallow trench isolation region, and wherein an upper surface of the source region or the drain region that extends across the shallow trench isolation regions includes a notch.

16. The integrated circuit of claim 7, further comprising:
   at least one power rail at a boundary of the integrated circuit; and
   a via connecting the source contact of one of the plurality of field effect transistors to the at least one power rail.

* * * * *